(12) United States Patent
Chen et al.

(10) Patent No.: US 11,581,882 B2
(45) Date of Patent: Feb. 14, 2023

(54) METHOD AND ELECTRONIC DEVICE FOR THE PULSE-MODULATED ACTUATION OF A LOAD

(71) Applicant: Continental Teves AG & Co. oHG, Frankfurt (DE)

(72) Inventors: Ling Chen, Darmstadt (DE); Frank Michel, Rosbach v. d. Höhe (DE); Micha Heinz, Darmstadt (DE)

(73) Assignee: Continental Teves AG & Co. OHG, Frankfurt am Main (DE)

( * ) Notice: Subject to any disclaimer, the term of this patent is extended or adjusted under 35 U.S.C. 154(b) by 421 days.

(21) Appl. No.: 15/806,880

(22) Filed: Nov. 8, 2017

(65) Prior Publication Data

US 2018/0069539 A1 Mar. 8, 2018

Related U.S. Application Data

(63) Continuation of application No. PCT/EP2016/061109, filed on May 18, 2016.

(30) Foreign Application Priority Data

May 22, 2015 (DE) ..................... 10 2015 209 469.3

(51) Int. Cl.
*H03K 5/04* (2006.01)
*H03K 7/06* (2006.01)
*H03K 7/08* (2006.01)

(52) U.S. Cl.
CPC ................. *H03K 5/04* (2013.01); *H03K 7/06* (2013.01); *H03K 7/08* (2013.01)

(58) Field of Classification Search
CPC ............... H03K 5/04; H03K 7/06; H03K 7/08
See application file for complete search history.

(56) References Cited

U.S. PATENT DOCUMENTS

2008/0157894 A1 7/2008 Hariton et al.
2009/0067487 A1\* 3/2009 Diewald .................. H03K 7/08
375/238

(Continued)

FOREIGN PATENT DOCUMENTS

CN 101517897 A 8/2009
DE 102007043340 A1 3/2009

(Continued)

OTHER PUBLICATIONS

Korean Office Action dated Dec. 20, 2018 for corresponding Korean Patent Application No. 10-2017-7033719.

(Continued)

*Primary Examiner* — Patrick O Neill (57) ABSTRACT

Method and electronic device for the pulse-modulated actuation of a load in a vehicle, a period duration ($T_{PM}$) of a frequency ($f_{PM}$) of the pulse modulation being able to be divided into an integer number (N) of sections ($T_{STEP}$), the duration of each of which corresponds to a multiple of a period duration ($T_{OSC}$) of a clock signal, and the method having the steps of: calculating a frequency ($f_{PM+1}$, $f_{PM}$) or period duration ($T_{PM+1}$, $T_{PM}$) of a period of the pulse modulation on the basis of underlying frequency modulation, and determining the duration of a respective section ($T_{STEP}$) of a period duration ($T_{PM}$) of the pulse modulation using the calculated frequency ($f_{PM+1}$, $f_{PM}$) or period duration ($T_{PM+1}$, $T_{PM}$) of a period of the pulse modulation.

10 Claims, 3 Drawing Sheets

(56) References Cited

U.S. PATENT DOCUMENTS

2010/0049470 A1    2/2010   Szajnowski
2010/0090775 A1    4/2010   Huda et al.
2011/0261875 A1   10/2011   Alexander et al.
2013/0015798 A1    1/2013   Wright

FOREIGN PATENT DOCUMENTS

WO     2008095145 A1    8/2008
WO     2014178673 A1   11/2014

OTHER PUBLICATIONS

International Search Report and Written Opinion dated Sep. 1, 2016 from corresponding International Patent Application No. PCT/EP2016/061109.
German Search Report dated Apr. 5, 2016 for corresponding German Patent Application No. 10 2015 209 469.3.
Chinese Office Action dated Aug. 4, 2020 for the counterpart Chinese Patent Application No. 20168002945732.
Chinese Notice of Allowance dated Mar. 4, 2021 for the counterpart Chinese Patent Application No. 20168002945732.

* cited by examiner

METHOD AND ELECTRONIC DEVICE FOR THE PULSE-MODULATED ACTUATION OF A LOAD

CROSS REFERENCE TO RELATED APPLICATIONS

This application claims the benefit of International application No. PCT/EP2016/061109, filed May 18, 2016, which claims priority to German application No. 10 2015 209 469.3, filed May 22, 2015, each of which is hereby incorporated by reference.

TECHNICAL FIELD

The technical field relates to a method and/or electronic device for the pulse-modulated actuation of a load in a vehicle.

BACKGROUND

Pulse-width-modulation ("PWM") actuation is often used in electronic control units for an anti-lock braking system ("ABS") and/or an electronic stability program ("ESP") in order to implement digital/analog conversion, for example for actuating the valves, operating the pump, or brightness-controllable warning lamps. Such a method is described, for example, in German patent publication No. DE 10 2012 213 874 A1, in which an actual duty factor of the PWM is changed from a first duty factor to a second duty factor in order to limit peak currents and the maximum gradient of the current edges when actuating a pump motor. The PWM actuations are usually generated by integrated circuits (e.g., microcontroller and mixed-signal circuit). However, the disadvantage of the actuation with a pulse-width-modulated signal may be that the frequent switching-on and switching-off of the output driver stages results in increased electromagnetic radiation and/or disruption of the energy supply network in the vehicle. A selected fixed PWM frequency may also become noticeable as undesired noise in the vehicle. These disadvantages are partially compensated for using complicated techniques outside the integrated circuits, for example, stabilization circuits for the voltage supply at the level of the electronic control unit or noise-suppressing measures in the vehicle.

As such, it is desirable to present a cost-effective but improved electromagnetic compatability, in particular emitted interference, and to reduce the emission of background noise. In addition, other desirable features and characteristics will become apparent from the subsequent summary and detailed description, and the appended claims, taken in conjunction with the accompanying drawings and this background.

BRIEF SUMMARY

A method for the pulse-modulated actuation of a load in a vehicle, according to one exemplary embodiment, is described herein. A period duration of a frequency of the pulse modulation is able to be divided into an integer number of sections. The duration of each section corresponds to a multiple of a period duration of a clock signal. The method includes calculating a frequency or period duration of a period of the pulse modulation on the basis of underlying frequency modulation. The method also includes determining the duration of a respective section of the period duration of the pulse modulation using the calculated frequency or period duration of a period of the pulse modulation.

It is therefore advantageously possible to implement frequency modulation, in particular for execution by a digital circuit inside a digital circuit or a mixed-signal circuit (e.g., hardware implementation), thus enabling cost-effective production and resource-saving operation. It is possible to generate frequencies, the sections of which cannot be generated by integer multiples of the clock signal, which enables frequency modulation which can be tuned in a comparatively fine manner. The frequency modulation advantageously makes it possible to distribute the interference energy to a wide frequency band, thus making it possible to improve the electromagnetic compatibility, in particular the emitted interference, and to reduce the emission of background noise of the underlying electronic device.

The clock signal may be a periodic clock signal which is generated by an oscillator, but may also be a clock signal derived therefrom, for example by frequency dividers. In this case, the pulse-modulated signal is used, in particular, to actuate an output stage which switches the load circuit(s) of the loads, as a result of which a mean current or a mean voltage is established according to the actuation. Depending on the implementation of the circuit, the actuation signal is "1" (pulse), for example, for a predefined number of sections and the actuation is "0" for the further course of the PWM period. The duration of a period of the pulse modulation is variable on account of the frequency modulation. Nevertheless, the predefined number of sections forming the pulse may preferably likewise be predefined, with the result that a temporal consistency of the pulse width over the frequency range of the frequency modulation or additional pulse-width modulation for each actuation frequency can be achieved, for example. In this respect, according to the invention, this may be pulse-frequency modulation superimposed on the pulse-width modulation, pure pulse-frequency modulation or pulse-width modulation superimposed on the pulse-frequency modulation.

According to one preferred development of the method, the frequency or period duration of a period of the pulse modulation is calculated by means of a recursive calculation, a frequency or period duration of a preceding period of the pulse modulation being used. Multiplication and division can therefore be achieved in a parallel manner by means of additions and subtractions.

The frequency or period duration of a subsequent period of the pulse modulation is preferably calculated during an ongoing period of the pulse modulation. Alternatively, it is possible to calculate, for example, the frequency or period duration of an ongoing period of the pulse modulation during—in particular comparatively shortly after the beginning of—the ongoing period of the pulse modulation.

The frequency or period duration of a subsequent period of the pulse modulation is preferably calculated precisely once during an ongoing period of the pulse modulation. This advantageously makes it possible to calculate the frequency or period duration of the subsequent period in a more resource-saving manner.

A remainder, which arises when calculating the frequency or period duration of the period of the pulse modulation, is preferably taken into account within a subsequent period of the pulse modulation. As a result, the error which is made when calculating the frequency or period duration of the subsequent period of the pulse modulation is taken into account.

The underlying frequency modulation preferably follows a predefined frequency change profile. This enables optimization with respect to the avoidance of particular frequencies for the purpose of reducing the emitted interference, for example. In this case, the frequency of the pulse-modulated signal is expediently varied between a minimum frequency and a maximum frequency.

The approximation that the frequencies of successive periods of the pulse modulation or the period durations of the pulse modulation are approximately the same is used to calculate the frequency or period duration of the period of the pulse modulation. An error which occurs as a result of the approximation can be advantageously disregarded for a multiplicity of applications.

The duration of the sections of a period of the pulse modulation is preferably iteratively determined separately for each section using the frequency or period duration of an ongoing period of the pulse modulation. This makes it possible to calculate the section durations with particularly little effort.

According to one development of the invention, the duration of a respective section of the period duration of the pulse modulation is also determined on the basis of a ratio value of the duration of a section to the period duration of the clock signal.

According to one preferred embodiment of the invention, the following steps are carried out in order to determine the duration of the sections of a period of the pulse modulation, where $R_{STEP}$ represents a remainder value, $f_{OSC}$ represents a frequency of the clock signal, N represents the number of sections and $f_{PWM}$ represents the frequency of a period of the pulse modulation:

1. Initializing the remainder with a value equal to zero at the beginning of a period of the pulse modulation,
2. Performing an allocation:

$$R_{STEP} \xleftarrow{} R_{STEP} + \frac{f_{OSC}}{N} - f_{PWM}$$

at the start of a section,
3. Performing an allocation:

$$R_{STEP} \xleftarrow{} R_{STEP} - f_{PWM}$$

after a period of the clock signal, and
4. Terminating the section and performing the second step if the remainder is less than the frequency of the period of the pulse modulation, and otherwise repeating the third step.

During the calculations or allocations, additional parameters and/or constants may possibly be taken into account and/or the calculations as such—given substantially the same result—can be carried out in an alternative manner.

The number of sections within a period of the pulse modulation is preferably selected as a power of two, the exponent being an integer. As a result, a division by N (see second step) corresponds to a shift operation by the number of digits stated in the exponent, thus enabling a resource-saving calculation, even for an implementation in hardware. The expression $f_{OSC}/N$ (second step) is expediently constant within an actuation.

The invention also describes an electronic device for the pulse-modulated actuation of a load in a vehicle, which device has at least one circuit for generating a pulse-modulated signal, which circuit can be operated using a clock signal, a period duration of the pulse-modulated signal being able to be divided into an integer number of sections, the duration of each of which corresponds to a multiple of a period duration of the clock signal, the device also being distinguished by the fact that the circuit is configured to generate a pulse-modulated signal of different period durations or frequencies, the pulse-modulated signal being able to have, within a period duration, a non-integer mean value of ratio values of the duration of the sections of a period of the pulse modulation to the period duration of the clock signal. The next pulse modulation frequency to be actuated is therefore calculated with little circuitry.

According to one advantageous development, the circuit is configured to generate sections of different time periods within a period duration of the pulse-modulated signal.

The electronic device is preferably configured in such a manner that it can execute or executes the method according to the invention.

Substantially the same advantages as those already described for the method according to the invention apply to the device according to the invention.

BRIEF DESCRIPTION OF THE DRAWINGS

Further embodiments emerge from the following description of exemplary embodiments on the basis of figures, in which.

and

DETAILED DESCRIPTION

Figure 1:
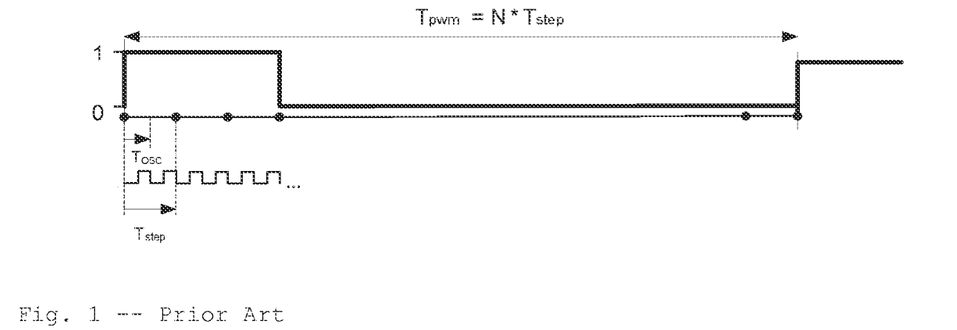
FIG. 1 schematically shows exemplary frequency modulation for generating a pulse-modulated signal ("PM signal") using an integer divisor V=2.

FIG. 1 shows an example of a period of a conventional PWM actuation. Synchronous digital circuits are operated by means of a base clock with the period duration $T_{OSC}$ or by means of a clock signal derived therefrom. A PWM period of the duration $T_{PWM}$ is divided in this case into N sections of the duration $T_{STEP}$, each section of the length $T_{STEP}$ corresponding to an integer number of clock pulses of the period duration $T_{OSC}$ of the base clock. The ratio $T_{STEP}/T_{OSC}$ in this determined by divisor $V_{PWM}$. The divisor is V=2 according to the example in FIG. 1.

Depending on a mean current to be set for the purpose of actuating a load, the actuation signal is "1" for a particular number of sections within the PWM period and the actuation is "0" for the further course of the PWM period. This PWM signal can be used to switch a pump driver, for example, on and off.

The section width $T_{STEP}$ within a PWM period is constant in this case. Therefore, particular discrete period durations $T_{PWM}$ result on the basis of the base clock with the step width $T_{OSC}$:

$$T_{PWM} = T_{STEP} \cdot N = T_{OSC} \cdot V_{PWM} \cdot N$$

where the values of $V_{PWM}$ and N are integers.

This constitutes a considerable restriction, in particular in mixed-signal circuits, since the oscillator frequency with the period duration $T_{OSC}$ cannot be stipulated in an arbitrary manner in these cases. If, for example, an oscillator frequency of 50 MHz and N=1024 are chosen, only the discrete frequencies:

$f_{PWM1}$=48.8 kHz
$f_{PWM2}$=24.4 kHz
$f_{PWM3}$=16.3 kHz
$f_{PWM4}$=12.2 kHz
...

can be achieved.

Figure 2:
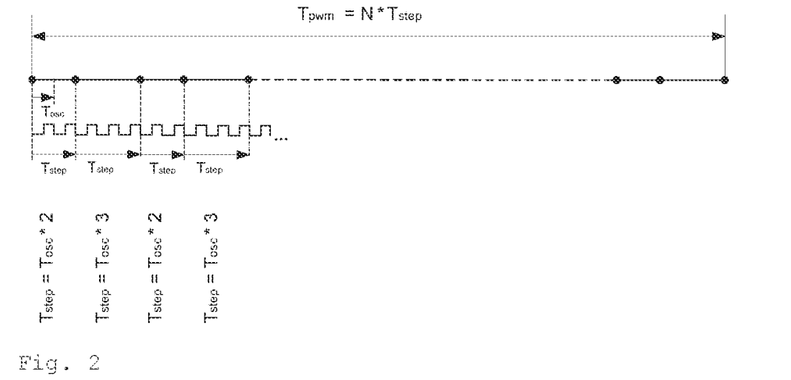
FIG. 2 schematically shows exemplary frequency modulation for generating a PM signal using a mean divisor V=2.5 over a period $T_{PWM}$ of the pulse modulation (PM period)

FIG. 2 shows an exemplary embodiment in which the time periods $T_{STEP}$ of the steps within a PM period may have different lengths, these still being formed in the integer ratio to the base clock of the period duration $T_{OSC}$, or having a different number of base clocks of the period duration $T_{OSC}$. Since pure pulse-width modulation is not necessarily present, the more general expression pulse modulation ("PM") is used. In contrast to the embodiment according to FIG. 1, the time periods $T_{STEP}$ of the steps have different divisors $V_{PM}$, with the result that the divisor $V_{PM}$ has a mean value of 2.5 over the period duration $T_{PM}$ of the PM. This enables comparatively finely tunable frequency modulation of the period durations $T_{PM}$ of the PM, as a result of which it is possible to distribute interference energy to a wide frequency band. Within a PM period, the maximum error caused by this procedure is therefore a base clock $T_{OSC}$.

Figure 3:
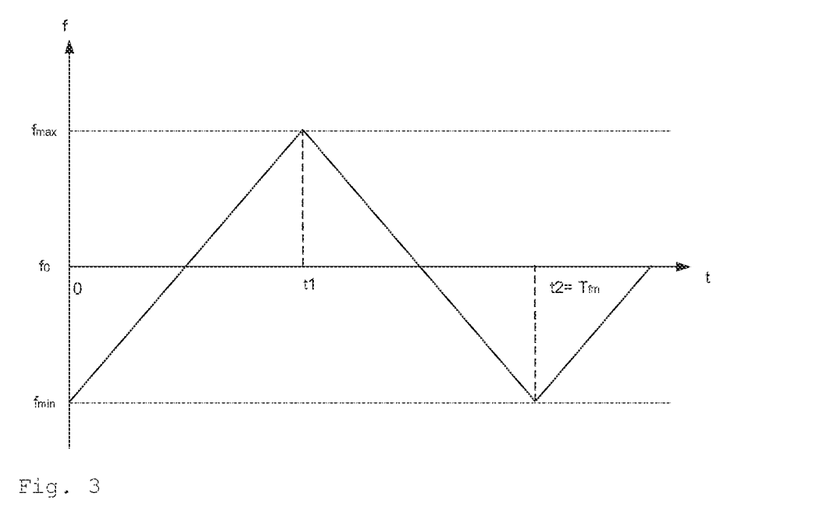
FIG. 3 schematically shows an exemplary frequency profile during frequency modulation.

FIG. 3 illustrates, by way of example, a frequency profile during frequency modulation. Starting from the center frequency $f_{PM}=1/T_{PM}$, the frequency during the ongoing operation of an underlying system or during the actuation of a load is varied in a triangular manner between the two extreme values $f_{MIN}$ and $f_{MAX}$ by means of a frequency-modulated voltage or a frequency-modulated current. In this case, the modulation frequency $f_{FM}=1/T_{FM}$ determines the speed of the frequency change.

It is explained below how, starting from the frequency profile according to FIG. 3, a non-integer value $V_{PM}$ can be calculated in order to obtain PM actuation corresponding to the example in FIG. 2.

The following values are given for the calculation:
$f_{PM}=1/T_{PM}$ Desired center frequency of the PM actuation
$f_{MIN}=1/T_{MIN}$ Minimum PM actuation frequency
$f_{MAX}=1/T_{MAX}$ Maximum PM actuation frequency
$f_{FM}=1/T_{FM}$ Modulation frequency
$f_{OSC}=1/T_{OSC}$ Base clock of the digital circuit The frequency profile according to FIG. 3 can be generally represented as a function:

$$f(t) = \frac{f_{MAX} - f_{MIN}}{t_1} \cdot t + f_{MIN} = \frac{2 \cdot (f_{MAX} - f_{MIN})}{T_{FM}} \cdot t + f_{MIN} \text{ for}$$

$0 \le t \le t_1$, and $$f(t) = \frac{f_{MIN} - f_{MAX}}{t_2 - t_1} \cdot (t - t_1) + f_{MAX} = -\frac{2 \cdot (f_{MAX} - f_{MIN})}{T_{PM}} \cdot (t - t_1) + f_{MAX}$$

for $t_1 \le t \le t_2$.

Figure 4:
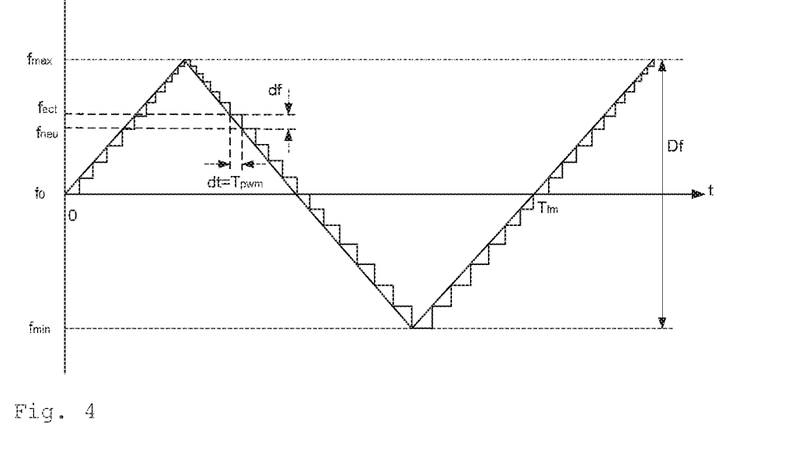
FIG. 4 schematically shows an exemplary frequency profile using a recursive calculation of the pulse modulation frequency ("PM frequency")

The calculation of the frequency for any desired times t is not absolutely necessary inside a digital circuit for PM actuation since, in particular, the distance between two successive rising signal edges is relevant as the period duration $T_{PM}$. It therefore generally suffices to calculate the PM frequency with the period duration $T_{PM}$ once for each PM period. A recursive method which is explained on the basis of FIG. 4 may be used to calculate the PM frequency $f_{PM+1}$ of the next PM period, in which case the following apply:

$$df = f_{PM+1} - f_{PM} = \pm \frac{f_{MIN} - f_{MAX}}{T_{FM}/2} \cdot dt = \pm \frac{2 \cdot (f_{MIN} - f_{MAX})}{T_{FM}} \cdot T_{PM}$$

$$f_{PM-1} = df + f_{PM} = \pm \frac{2 \cdot (f_{MIN} - f_{MAX}) \cdot f_{FM}}{f_{PM}} + f_{PM}$$

$$f_{PM+1} = \frac{k}{f_{PM}} + f_{PM} \text{ with } k = \pm 2 \cdot (f_{MAX} - f_{MIN}) \cdot f_{FM}.$$

The sign ± in this case respectively distinguishes whether there is a rising or falling edge of the PM frequency. The step widths df and dT change with the PM frequency result from the PM period duration, which changes with the PM frequency.

In order to determine the frequency $f_{PM+1}$, a calculation of the following form is carried out:

$$a \cdot \frac{b}{c} \text{ with } a = (f_{MAX} - f_{MIN}), b = f_{FM} \text{ and } c = f_{PM}.$$

There are countless ways of calculating the term $$a \cdot \frac{b}{c}.$$

Figure 5:
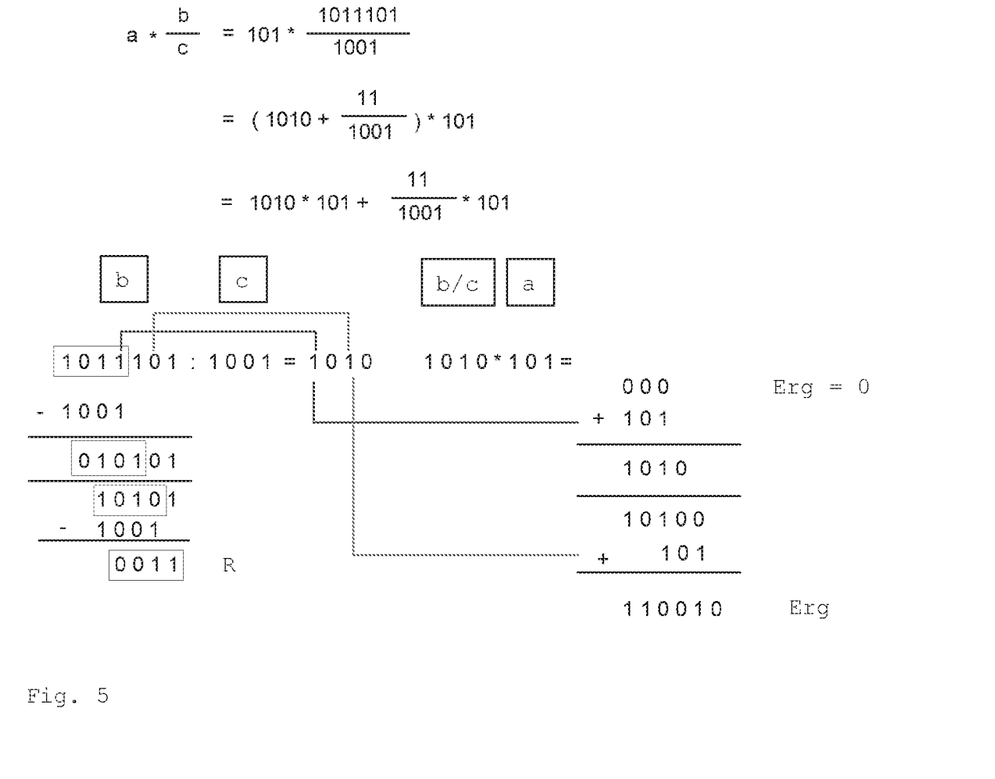
FIG. 5 schematically shows an example of a binary sequential calculation of the term $$a \cdot \frac{b}{c};$$

In this case, the exemplary embodiment corresponding to FIG. 5 shows a possible resource-efficient procedure for the binary, sequential calculation thereof. According to this calculation, neither a multiplier nor a divider is required, which is advantageous inside digital circuits since adders, subtractors and shift operations can be implemented in a comparatively simple manner and multipliers and dividers can be implemented in a considerably more complicated manner.

In the calculation example according to FIG. 5, the following bit widths were selected for the variables a, b, and c: $n_a=3$, $n_b=7$ and $n_c=4$.

The following method steps may be carried out:
1. A value Erg is initialized with 0, a step counter is likewise set to 0 and a maximum value ($>=n_b-n_c$) which specifies the computation accuracy is stipulated for the step counter.
2. If the first $n_c$ bits of the variable b are greater than or equal to the value of c, c is subtracted from the first $n_c$ bits of b. At the same time, a is added to the value Erg. If the first $n_c$ bits of b are less than c, this step is skipped and step 3 is carried out.

3. The step counter is incremented by 1. If the step counter has not reached the maximum value, b and Erg are shifted one bit to the left and the method jumps to step 2. If the counter has reached the maximum value, the computation operation is terminated.

Erg now represents the result of the computation operation involving multiplication and division. This calculation is carried out in each PM period in order to determine the PM frequency $f_{PM+1}$ of the next PM period. A division remainder R often occurs during this operation and is preferably taken into account in the next iteration step or when calculating the PM frequency of the PM period which follows the next PM period:

$$f_{PM+1} = \frac{k}{f_{PM}} + \frac{R}{f_{PM-1}} + f_{PM} \text{ with } k = \pm 2 \cdot (f_{MAX} - f_{MIN}) \cdot f_{FM}.$$

In this case, $f_{PM-1}$ represents the PM frequency of the preceding PM period, $f_{PM}$ represents the PM frequency of the current PM period and $f_{PM+1}$ represents the PM frequency of the next PM period. However, this would require an additional division operation and a plurality of additional subtraction and shift operations. For further simplification when calculating the next PM frequency, it is assumed that two successive PM periods are very similar, with the result that: $f_{PM-1} \approx f_{PM}$.

The following is obtained:

$$f_{PM+1} = \frac{R}{f_{PM-1}} + \frac{k}{f_{PM}} + f_{PM} \approx \frac{R+k}{f_{PM}} + f_{PM} \quad \text{Equation 1}$$

The divisor $V_{PM+1}$ of the subsequent PM period can be determined from the frequency $f_{PM+1}$ calculated using equation 1:

$$T_{STEP} = V_{PM+1} \cdot T_{osc}$$

$$V_{PM+1} = \frac{T_{STEP}}{T_{OSC}} = \frac{T_{PM}/N}{T_{OSC}} = \frac{f_{OSC}}{N \cdot f_{PM+1}}$$

The value $V_{PM+1}$ is generally not an integer. As already explained for FIG. 2, the step widths within a PM period have different lengths as a result. A division operation is also expediently avoided here for reasons of saving resources.

In digital circuits, the number N of steps with the period duration $T_{STEP}$ within a PM period is preferably selected as a power of two, that is to say $N=2^M$, where M is an integer. As a result, the division by N corresponds to a shift operation by M digits. The expression $f_{OSC}/N$ is expediently constant within PM actuation, thus making it possible to achieve a particularly resource-efficient calculation.

The actual time period $T_{STEP}$ of the sections of a PM period or the number of base clock periods $T_{OSC}$ of the respective section is iteratively determined using the following algorithm:

1. A remainder $R_{STEP}$ is initialized with 0 at the beginning of a pulse modulation period.
2. At the start of a section of the length $T_{STEP}$, the following allocation:

$$R_{STEP} \stackrel{!}{=} R_{STEP} + \frac{f_{OSC}}{N} - f_{PM}$$

is carried out, where $$R_{STEP} + \frac{f_{OCS}}{N} - f_{PM} = R_{STEP} + f_{PM} \cdot (V_{PM} - 1)$$

and $f_{PM}$ and $V_{PM}$ represent the values $f_{PM+1}$ and $V_{PM+1}$ determined in the preceding PM period using equation 1.

3. After a base clock period $T_{OSC}$, the following allocation $$R_{STEP} \stackrel{!}{=} R_{STEP} - f_{PM}$$

is carried out.

4. If the remainder $R_{STEP}$ is less than $f_{PM}$, the step $T_{STEP}$ is finished and the method jumps to 2 in order to determine the length of the next step, otherwise 3 is repeated.

The frequency $f_{PM+1}$ of the next period of the pulse modulation can therefore be recursively determined using the parameters $f_{OSC}/N$, $f_{MIN}$, $f_{MAX}$, $f_{FM}$, and $f_{PM}$, in which case $f_{OSC}/N$, $f_{MIN}$, $f_{MAX}$, and $f_{FM}$, in particular, can also remain constant over a multiplicity of periods of the pulse modulation.

Figure 6:
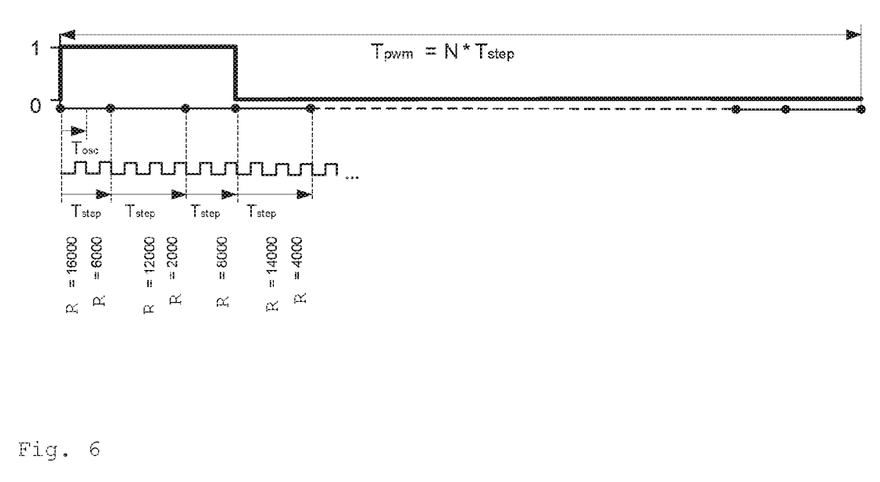
FIG. 6 schematically shows exemplary frequency modulation for generating a PM signal with a mean divisor $V_{PWM}=2.6$ over a period $T_{PWM}$ of the pulse modulation.

FIG. 6 shows an example of a calculation of the step width $T_{STEP}$. The following input variables were used for this example:

$f_{OSC}$=6.656 MHz
$N=2^8=256$
$f_{PM}$=10 kHz

These input variables result in divisors $V_{PM}$ of 2.6.

A remainder $R_{STEP}$ is retained from step to step and makes it possible to achieve the desired value of $V_{PM}=2.6$ on average.

According to FIG. 6, and also for the embodiment according to FIG. 1, the PM actuation signal is oriented to the number of steps of the step width $T_{STEP}$ irrespective of the fact that this step width now varies slightly. Within the PM period $T_{PM}$, the actuation signal is "1" for a particular number of steps of the step width $T_{STEP}$ and the actuation is "0" for the further course of the PM period.

Estimation of the Maximum Total Error of Half a PM Period

The simplification $f_{PM-1} \approx f_{PM}$ results in an error F which can occur during each iterative computation step:

$$F = \left| \frac{R+k}{f_{PM}} - \left( \frac{R}{f_{PM-1}} + \frac{k}{f_{PM}} \right) \right| = \left| \frac{R}{f_{PM}} - \frac{R}{f_{PM-1}} \right| = \left| R \cdot \frac{f_{PM-1} - f_{PM}}{f_{PM-1} \cdot f_{PM}} \right|$$

Within half a PM period, the errors F of a PM period are added to form a total error $F_G$ of half a PM period:

$$F_G = \left| \sum_{T/2} F \right| = \left| \sum_{T/2} R \cdot \frac{f_{PM-1} - f_{PM}}{f_{PM-1} \cdot f_{PM}} \right|$$

The maximum total error $F_{MAX}$ of half a PM period can be estimated by:

$$F_{max} = \left| \sum_{T/2} F \right| < f_{max} \cdot \frac{f_{MAX} - f_{MIN}}{f_{MIN} \cdot f_{MIN}}$$

This estimation is composed of three considerations, in particular:

Remainder R can never become greater than the current frequency $f_{PM}$. If the remainder R is replaced with the maximum frequency $f_{MAX}$, an estimation is carried out according to the above.

The error becomes maximal, the smaller the denominator becomes, and the frequencies $f_{PM-1}$ and $f_{PM}$ are therefore each replaced with $f_{MIN}$.

The iteration formula results in a sum of the enumerators in the form: $f_1-f_2+f_2-f_3+f_3-f_4 \ldots =f_{MAX}-f_{MIN}$.

If an estimation in % is required, it is also possible to divide by the minimum PM frequency $f_{MIN}$ to give the following:

$$F_{MAX}(\%) < \frac{f_{MAX} \cdot (f_{MAX} - f_{MIN})}{f_{MIN} \cdot f_{MIN} \cdot f_{MIN}}$$

For exemplary frequency modulations, the following results arise for the maximum total error of half a PM period:

Example 1
$$f = 10 \text{ kHz} \pm 1 \text{ kHz}$$
$$F_{MAX} < \frac{11 \cdot 2}{9 \cdot 9 \cdot 9 \cdot 1000} \approx 0.00301\%$$

Example 2
$$f = 100 \text{ Hz} \pm 10 \text{ Hz}$$
$$F_{MAX} < \frac{110 \cdot 20}{90 \cdot 90 \cdot 90} \approx 0.301\%$$

In order to minimize the error, the extreme points $f_{MIN}$ and $f_{MAX}$ are preferably used as supporting points at which the recursive calculation is restarted by setting $f_{MAX}=f_{PM}$ and $f_{MIN}=f_{PM}$ in order to calculate $f_{PM+1}$ if the PM frequency is exceeded or is the same.

The invention claimed is:

1. A method for the pulse-modulated actuation of a load in a vehicle, a period duration ($T_{PM}$) or a frequency ($f_{PM}$) of the pulse modulation being able to be divided into an integer number (N) of sections ($T_{STEP}$), the duration of each of which corresponds to a multiple of a period duration ($T_{OSC}$) of a clock signal, wherein the method comprises:
   calculating a frequency ($f_{PM+1}$, $f_{PM}$) or period duration ($T_{PM+1}$, $T_{PM}$) of a period of the pulse modulation on the basis of underlying frequency modulation; and
   determining the duration of a respective section ($T_{STEP}$) of a period duration ($T_{PM}$) of the pulse modulation using the calculated frequency ($f_{PM+1}$, $f_{PM}$) or period duration ($T_{PM+1}$, $T_{PM}$) of a period of the pulse modulation;
   wherein the following steps are carried out in order to determine the duration ($T_{STEP}$) of the sections of a period of the pulse modulation, where $R_{STEP}$ represents a remainder value, $f_{OSC}$ represents a frequency of the clock signal, N represents the number of sections and $f_{PM}$ represents the frequency of the pulse modulation:
   1. Initializing the remainder ($R_{STEP}$) with a value equal to zero at the beginning of a period of the pulse modulation;
   2. Performing an allocation:

$$R_{STEP} = R_{STEP} + \frac{f_{OSC}}{N} - f_{PWM}$$

at the start of a section;
   3. Performing an allocation: $R_{STEP}=R_{STEP}-f_{PM}$ after a period of the clock signal; and
   4. Terminating the section and performing the second step if the remainder ($R_{STEP}$) is less than the frequency of the period of the pulse modulation ($f_{PM}$), and otherwise repeating the third step.

2. The method as claimed in claim 1, wherein the frequency ($f_{PM+1}$, $f_{PM}$) or period duration ($T_{PM+1}$, $T_{PM}$) of a period of the pulse modulation is calculated by means of a recursive calculation, a frequency ($f_{PM-1}$) or period duration ($T_{PM-1}$) of a preceding period of the pulse modulation being used.

3. The method as claimed in claim 1, wherein the frequency ($f_{PM+1}$) or period duration ($T_{PM+1}$) of a subsequent period of the pulse modulation is calculated during an ongoing period of the pulse modulation.

4. The method as claimed in claim 1, wherein the frequency ($f_{PM+1}$) or period duration ($T_{PM+1}$) of the subsequent period of the pulse modulation is calculated precisely once during an ongoing period of the pulse modulation.

5. The method as claimed in claim 1, wherein the underlying frequency modulation follows a predefined frequency change profile.

6. The method as claimed in claim 1, wherein an approximation that the frequencies ($f_{PM+1}$, $f_{PM}$) of successive periods of the pulse modulation or the period durations ($T_{PM+1}$, $T_{PM}$) of the pulse modulation are approximately the same is used to calculate the frequency ($f_{PM+1}$, $f_{PM}$) or period duration ($T_{PM+1}$, $T_{PM}$) of the period of the pulse modulation.

7. The method as claimed in claim 1, wherein the duration ($T_{STEP}$) of the sections of a period of the pulse modulation is iteratively determined separately for each section using the frequency ($f_{PM}$) or period duration ($T_{PM}$) of an ongoing period of the pulse modulation.

8. The method as claimed in claim 7, wherein the duration ($T_{STEP}$) of a respective section of the period duration ($T_{PM}$) of the pulse modulation is also determined on the basis of a ratio value ($V_{PM}$) of the duration of a section ($T_{STEP}$) to the period duration ($T_{OSC}$) of the clock signal.

9. An electronic device for the pulse-modulated actuation of a load in a vehicle, comprising:
   at least one circuit for generating a pulse-modulated signal, said circuit may be operated using a clock signal, a period duration ($T_{PM}$) of the pulse-modulated signal being able to be divided into an integer number (N) of sections ($T_{STEP}$), the duration of each of which corresponds to a multiple of a period duration ($T_{OSC}$) of the clock signal;
   said at least one circuit configured to generate a pulse-modulated signal of different period durations ($T_{PM}$) or frequencies ($f_{PM+1}$, $f_{PM}$), the pulse-modulated signal being able to have, within a period duration ($T_{PM}$), a non-integer mean value of ratio values ($V_{PM}$) of the duration of the sections ($T_{STEP}$) of a period of the pulse modulation to the period duration ($T_{OSC}$) of the clock signal;
   wherein the following steps are carried out by at least one circuit in order to determine the duration ($T_{STEP}$) of the sections of a period of the pulse modulation, where $R_{STEP}$ represents a remainder value, $f_{OSC}$ represents a frequency of the clock signal, N represents the number of sections and $f_{PM}$ represents the frequency of the pulse modulation:
   1. Initializing the remainder ($R_{STEP}$) with a value equal to zero at the beginning of a period of the pulse modulation;

2. Performing an allocation:

$$R_{STEP} = R_{STEP} + \frac{f_{OSC}}{N} - f_{PRM} \qquad 5$$

at the start of a section;
3. Performing an allocation: $R_{STEP}=R_{STEP}-f_{PM}$ after a period of the clock signal; and
4. Terminating the section and performing the second step if the remainder ($R_{STEP}$) is less than the frequency of the period of the pulse modulation ($f_{PM}$), and otherwise repeating the third step.

10. The electronic device as claimed in claim 9, wherein said at least one circuit is configured to generate sections of different time periods ($T_{STEP}$) within a period duration ($T_{PM}$) of the pulse-modulated signal.

* * * * *